(12) United States Patent
Kaitoh et al.

(10) Patent No.: US 12,132,117 B2
(45) Date of Patent: Oct. 29, 2024

(54) SEMICONDUCTOR DEVICE

(71) Applicant: Japan Display Inc., Tokyo (JP)

(72) Inventors: Takuo Kaitoh, Tokyo (JP); Akihiro Hanada, Tokyo (JP); Takashi Okada, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 497 days.

(21) Appl. No.: 17/561,996

(22) Filed: Dec. 27, 2021

(65) Prior Publication Data

US 2022/0209014 A1 Jun. 30, 2022

(30) Foreign Application Priority Data

Dec. 28, 2020 (JP) .................. 2020-218303

(51) Int. Cl.
*H01L 27/12* (2006.01)
*H01L 29/786* (2006.01)

(52) U.S. Cl.
CPC .... *H01L 29/7869* (2013.01); *H01L 29/78618* (2013.01)

(58) Field of Classification Search
None
See application file for complete search history.

(56) References Cited

U.S. PATENT DOCUMENTS

| 2012/0119206 A1* | 5/2012 | Wang | H01L 29/42384 257/E21.409 |
| 2014/0141565 A1* | 5/2014 | Hung | H01L 29/66969 438/104 |
| 2015/0048359 A1* | 2/2015 | Fukase | H01L 29/42384 257/43 |
| 2017/0278872 A1 | 9/2017 | Ohara | |
| 2020/0259020 A1 | 8/2020 | Watakabe et al. | |

FOREIGN PATENT DOCUMENTS

| JP | 2017-183312 A | 10/2017 |
| JP | 2020-129635 A | 8/2020 |

* cited by examiner

*Primary Examiner* — Benjamin P Sandvik
(74) *Attorney, Agent, or Firm* — XSENSUS LLP

(57) ABSTRACT

According to one embodiment, a semiconductor device includes a first insulating film formed of silicon nitride, a second insulating film disposed above the first insulating film and formed of silicon oxide, including a first region and a peripheral region surrounding the first region and thinner than the first region, an oxide semiconductor disposed on the second insulating film and intersecting the first region, a source electrode overlapping the peripheral region and a drain electrode overlapping the peripheral region. The first region is located between the source electrode and the drain electrode and separated from the source electrode and the drain electrode.

16 Claims, 6 Drawing Sheets

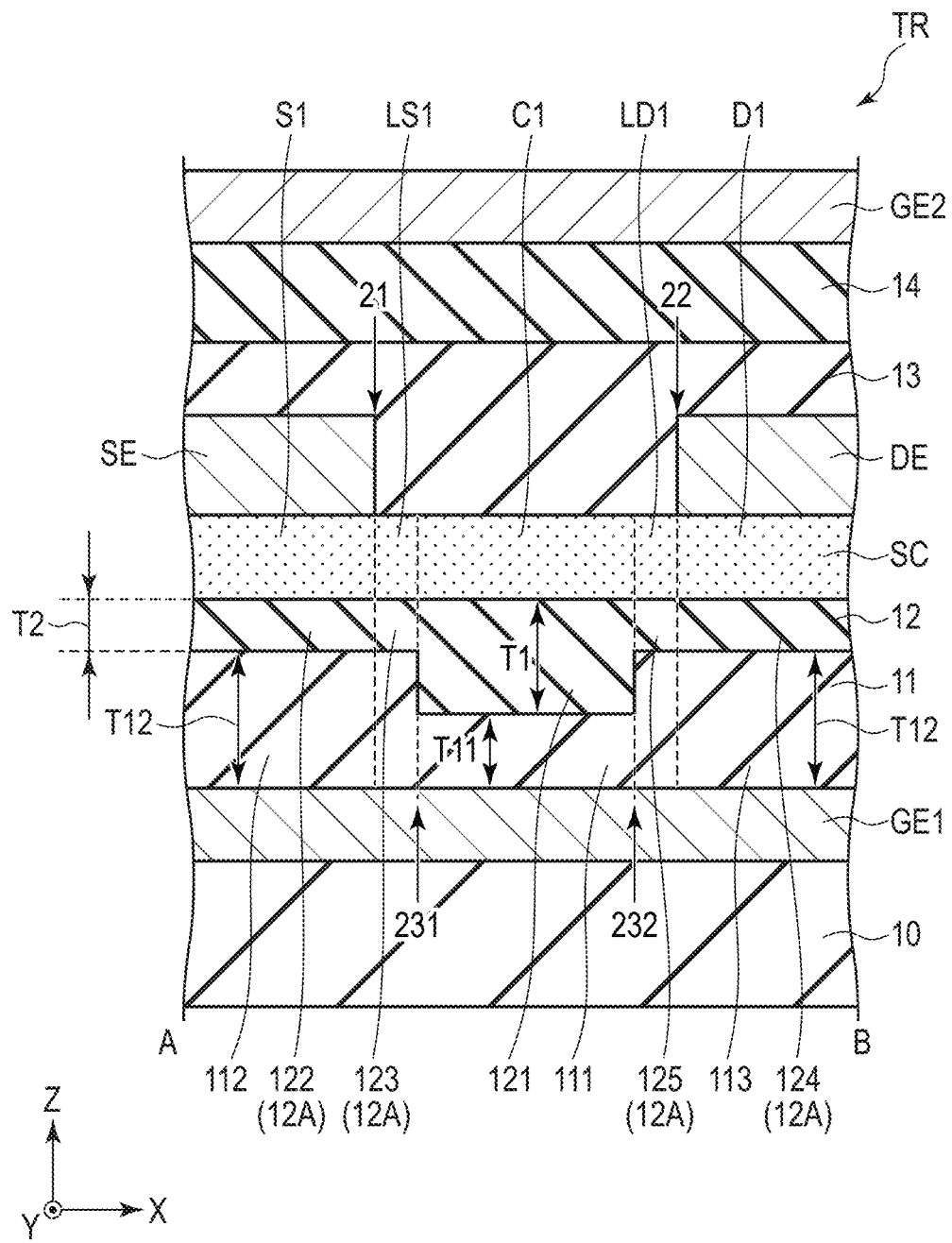
F I G. 2

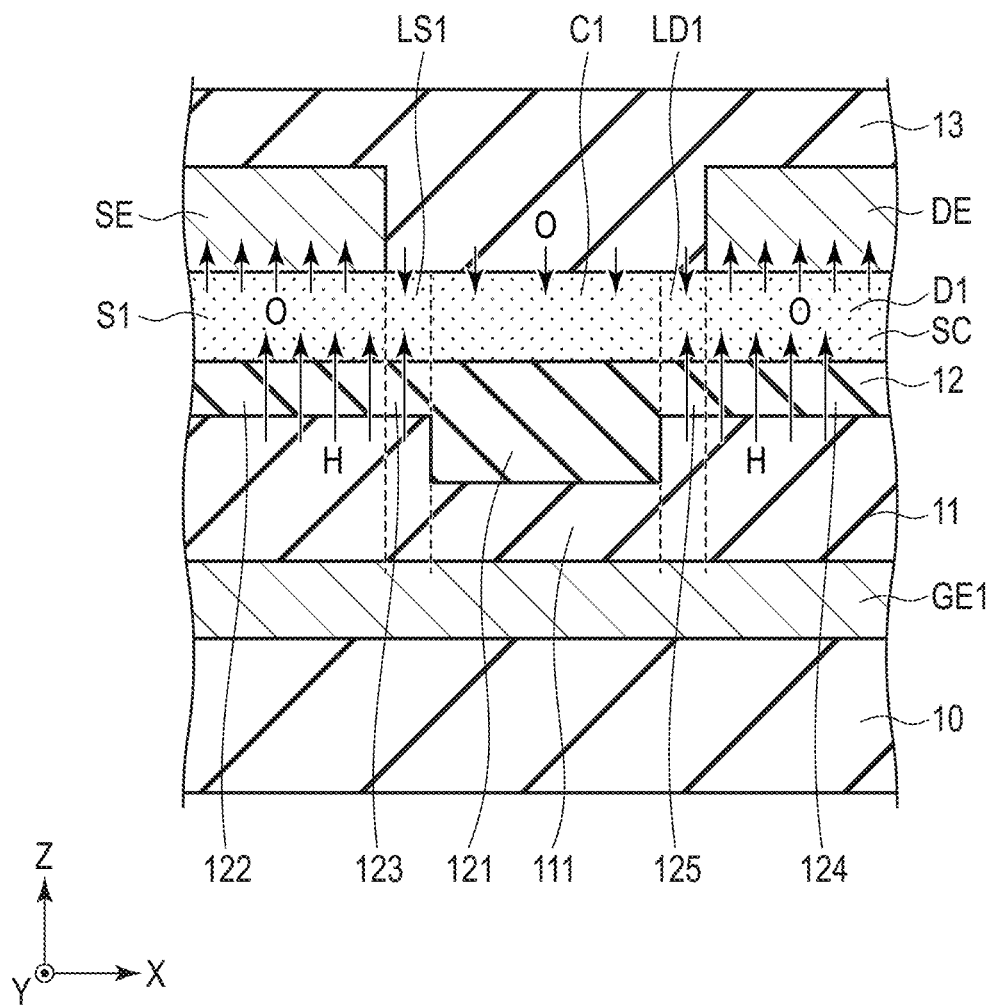
F I G. 3

SEMICONDUCTOR DEVICE

CROSS-REFERENCE TO RELATED APPLICATIONS

This application is based upon and claims the benefit of priority from Japanese Patent Application No. 2020-218303, filed Dec. 28, 2020, the entire contents of which are incorporated herein by reference.

FIELD

Embodiments described herein relate generally to a semiconductor device.

BACKGROUND

In recent years, various semiconductor devices such as display devices comprising transistors using oxide semiconductors have been proposed. In such transistors using oxide semiconductors, a high voltage is applied between the source and the drain, thereby causing degradation by hot carriers. As a results, the threshold voltage may shift significantly.

BRIEF DESCRIPTION OF THE DRAWINGS

FIG. 2 is a cross-sectional view showing an example of a transistor TR shown in FIG. 1.

FIG. 3 is a diagram illustrating a method of manufacturing an oxide semiconductor SC shown in FIG. 2.

DETAILED DESCRIPTION

Figure 1:
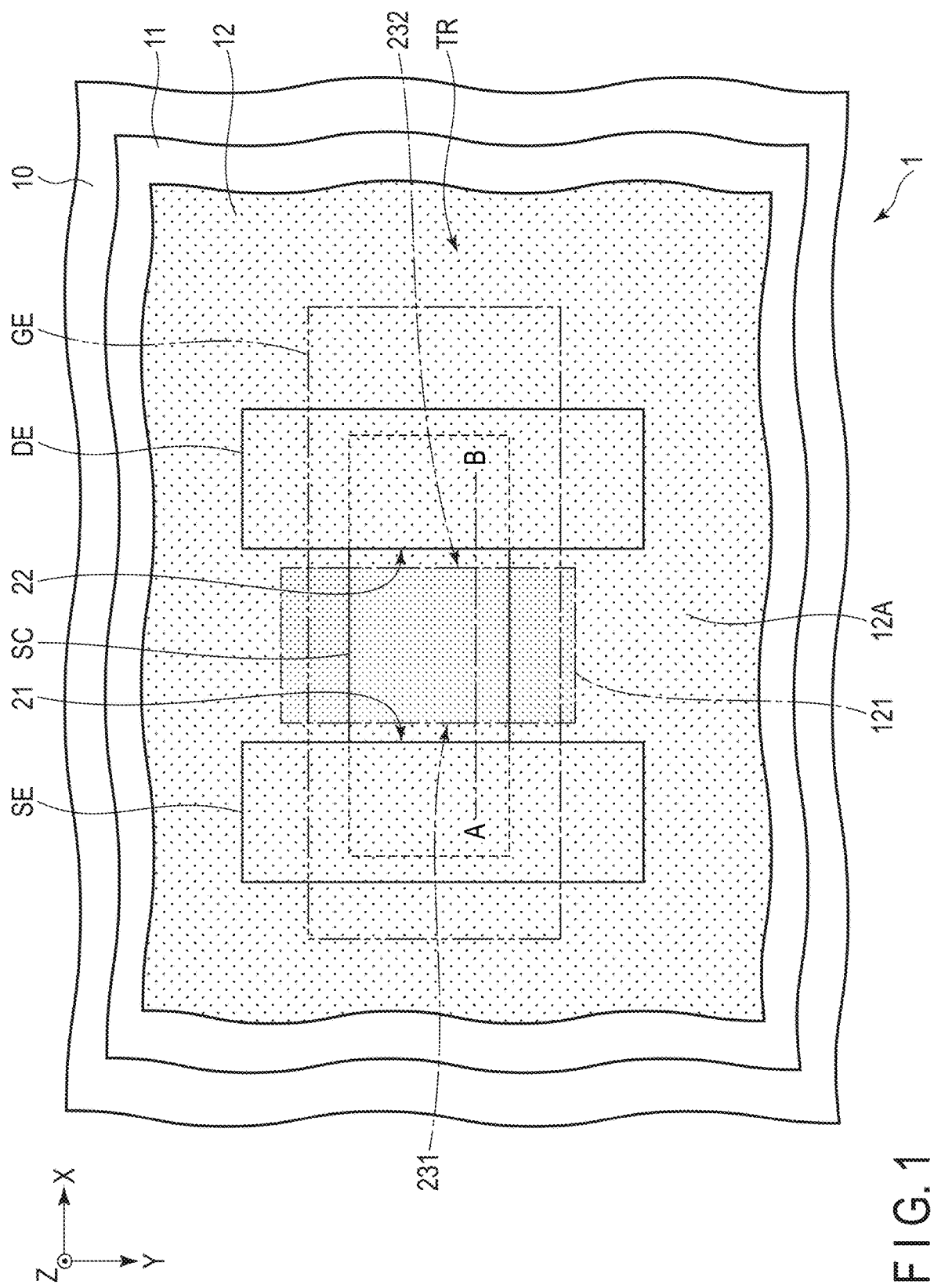
FIG. 1 is a plan view showing an example of a semiconductor device 1 according to an embodiment.

In general, according to one embodiment, a semiconductor device comprises an insulating substrate, a first insulating film disposed above the insulating substrate and formed of silicon nitride, a second insulating film disposed above the first insulating film and formed of silicon oxide, including a first region and a peripheral region surrounding the first region and thinner than the first region, an oxide semiconductor disposed on the second insulating film and intersecting the first region, a source electrode overlapping the peripheral region and in contact with the oxide semiconductor and a drain electrode overlapping the peripheral region, separated from the source electrode and in contact with the oxide semiconductor, and in planar view, the first region is located between the source electrode and the drain electrode, and separated from the source electrode and the drain electrode.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane, and viewing towards the X-Y plane is referred to as planar view.

A semiconductor device 1 of this embodiment is applicable to various display devices such as liquid crystal displays, organic electroluminescent displays, electrophoretic displays, and LED displays, as well as various sensors such as capacitive sensors and optical sensors, and other electronic devices.

FIG. 1 is a plan view showing an example of the semiconductor device 1 of this embodiment. The semiconductor device 1 comprises a base 10, a first insulating film 11, a second insulating film 12 and a transistor TR. FIG. 1 shows one transistor TR contained in the semiconductor device 1.

The base 10 is an insulating substrate formed of an insulating material such as glass or resin film. The first insulating film 11 is disposed on the base 10. The second insulating film 12 is disposed on the first insulating film 11.

The second insulating film 12 includes a first region 121 encircled by a single dotted line and a peripheral region 12A surrounding the first region 121. The first region 121 has a substantially constant film thickness. The peripheral region 12A has a film thickness less than that of the first region 121. That is, in the second insulating film 12, the first region 121 corresponds to a thick film region and the peripheral region 12A corresponds to a thin film region. The details of the second insulating film 12 will be described later by showing a cross section thereof.

The transistor TR comprises an oxide semiconductor SC, a gate electrode GE, a source electrode SE and a drain electrode DE.

The oxide semiconductor SC is disposed on the second insulating film 12 and intersects the first region 121. In the example shown in FIG. 1, the first region 121 extends along the second direction Y, and the oxide semiconductor SC extends along the first direction X. Both end portions of the oxide semiconductor SC along the first direction X overlap the peripheral region 12A, and a central part of the oxide semiconductor SC overlaps the first region 121.

The source electrode SE overlaps the peripheral region 12A and is in contact with one end portion of the oxide semiconductor SC. The drain electrode DE overlaps the peripheral region 12A and is in contact with the other end portion of the oxide semiconductor SC. The drain electrode DE is located on an opposite side to the source electrode SE while interposing the first region 121 therebetween, and is separated from the source electrode SE.

The gate electrode GE overlaps at least the portion of the oxide semiconductor SC, which is between the portion in contact with the source electrode SE and the portion in contact with the drain electrode DE, and in the example shown in FIG. 1, it overlaps substantially the entire oxide semiconductor SC.

In planar view, the first region 121 is located between the source electrode SE and the drain electrode DE, and is separated from the source electrode SE and the drain electrode DE. That is, between the first region 121 and the source electrode SE and between the first region 121 and the drain electrode DE, a peripheral region (thin film region) 12A is interposed. The source electrode SE and the portion of the oxide semiconductor SC, which is in contact with the source electrode SE do not overlap the first region 121, but overlap the peripheral region 12A. Similarly, the drain electrode DE and the portion of the oxide semiconductor SC, which is in contact with the drain electrode DE do not overlap the first region 121, but overlaps the peripheral region 12A.

The source electrode SE includes a first side edge 21 opposing the drain electrode DE, and the drain electrode DE includes a second side edge 22 opposing the source electrode SE. The first region 121 includes a first circumferential portion 231 and a second circumferential portion 232 of the circumferential portion indicated by the single dotted line, which intersect the oxide semiconductor SC. The first circumferential portion 231 is located on a side proximate to the source electrode SE, but does not overlap the first side edge 21. The second circumferential portion 232 is located on a side proximate to the drain electrode DE, but does not overlap the second side edge 22. Both the first circumferential portion 231 and the second circumferential portion 232 are located between the first side edge 21 and the second side edge 22.

FIG. 2 is a cross-sectional view of an example of the transistor TR shown in FIG. 1. The transistor TR described here comprises, as the gate electrode GE, a first gate electrode GE1 located below the oxide semiconductor SC and a second gate electrode GE2 located above the oxide semiconductor SC.

The first gate electrode GE1 is disposed on the base 10 and is covered by the first insulating film 11. In the example shown in FIG. 2, the first gate electrode GE1 is in contact with the base 10, but some other insulating film may be interposed between the base 10 and the first gate electrode GE1.

The first insulating film 11 is an inorganic insulating film formed of silicon nitride. The second insulating film 12 is an inorganic insulating film formed of silicon oxide. A lower surface of the second insulating film 12 is in contact with the first insulating film 11 and an upper surface of the second insulating film 12 is in contact with the oxide semiconductor SC.

The third insulating film 13 covers the source electrode SE and the drain electrode DE, and is in contact with the oxide semiconductor SC between the first side edge 21 of the source electrode SE and the second side edge 22 of the drain electrode DE. The third insulating film 13 is an inorganic insulating film formed of silicon oxide. In other words, the upper and lower surfaces of the oxide semiconductor SC are in contact with the inorganic insulating film which is silicon oxide.

The fourth insulating film 14 is located on the third insulating film 13. The fourth insulating film 14 is an inorganic insulating film formed of silicon nitride.

The second gate electrode GE2 is disposed on the fourth insulating film 14. The second gate electrode GE2 is electrically connected to the first gate electrode GE1.

The first gate electrode GE1, the second gate electrode GE2, the source electrode SE and the drain electrode DE are formed of, for example, a metal material such as aluminum (Al), titanium (Ti), molybdenum (Mo), tungsten (W), silver (Ag), copper (Cu) or chromium (Cr), or an alloy of any combination of these metal materials.

Here, the cross-sectional structure of the second insulating film 12 will be described in more detail.

The peripheral region 12A includes a second region 122, a third region 123, a fourth region 124 and a fifth region 125.

The second region 122 is a region located directly below the source electrode SE. The third region 123 is a region located between the first region 121 and the second region 122. In other words, the third region 123 is a region between the first side edge 21 of the source electrode SE and the first circumferential portion 231 of the first region 121.

The fourth region 124 is a region located directly below the drain electrode DE. The fifth region 125 is a region located between the first region 121 and the fourth region 124. In other words, the fifth region 125 is a region between the second side edge 22 of the drain electrode DE and the second circumferential portion 232 of the first region 121.

In the second insulating film 12, the film thicknesses along the third direction Z are as follows. The first region 121 has a substantially constant film thickness T1. The peripheral region 12A has a film thickness T2 that is less than the film thickness T1. The second region 122, the third region 123, the fourth region 124 and the fifth region 125 all have the same film thickness T2. That is, the first region 121 corresponds to a projecting portion of the second insulating film 12. For example, the film thickness T1 is 200 nm to 300 nm, and the film thickness T2 is 100 nm or less.

Focusing on the cross-sectional shape of the second insulating film 12, the first region 121 protrudes downward further than the peripheral region 12A. That is, while a step is formed on the lower surface of the second insulating film 12, the upper surface of the second insulating film 12 is a substantially flat surface. Therefore, the interface between the second insulating film 12 and the oxide semiconductor SC is a substantially flat surface.

Next, the cross-sectional structure of the first insulating film 11 will be described.

The first insulating film 11 includes a region 111 overlapping the first region 121, a region 112 overlapping the second region 122 and the third region 123, and a region 113 overlapping the fourth region 124 and the fifth region 125. The region 111 has a substantially constant film thickness T11. Each of the regions 112 and 113 has a film thickness T12 that is greater than the film thickness T11. In other words, the region 111 corresponds to a recess portion of the first insulating film 11. The lower surface of the first insulating film 11 is a substantially flat surface, and a step is formed on the upper surface of the first insulating film 11.

The oxide semiconductor SC includes a channel region C1, low-resistance regions LS1 and LD1, a source region S1 and a drain region D1. The low-resistance regions LS1 and LD1 are adjacent to the channel region C1. The low-resistance region LS1 is located between the channel region C1 and the source region S1. The low-resistance region LD1 is located between the channel region C1 and the drain region D1.

The channel region C1 is a region having the highest resistance in the oxide semiconductor SC and overlaps the first region 121 of the second insulating film 12 and the region 111 of the first insulating film 11.

The low-resistance regions LS1 and LD1 are regions with lower resistance than that of the channel region C1. The low-resistance region LS1 overlaps the third region 123 of the second insulating film 12 and the region 112 of the first insulating film 11. The low-resistance region LD1 overlaps the fifth region 125 of the second insulating film 12 and the region 113 of the first insulating film 11.

The channel region C1 and the low-resistance regions LS1 and LD1 are in contact with the second insulating film 12 and the third insulating film 13.

The source region S1 is a region with even lower resistance than that of the low-resistance region LS1 and overlaps the second region 122 of the second insulating film 12 and the region 112 of the first insulating film 11. The source region S1 is in contact with the second insulating film 12 and the source electrode SE.

The drain region D1 is a region of even lower resistance than that of the low resistance region LD1, and overlaps the fourth region 124 of the second insulating film 12 and the region 113 of the first insulating film 11. The drain region D1 is in contact with the second insulating film 12 and the drain electrode DE.

Of the oxide semiconductor SC, at least the channel region C1 and the low-resistance regions LS1 and LD1 are located directly above the first gate electrode GE1 and also directly below the second gate electrode GE2. In the example shown in FIG. 2, substantially the entire oxide semiconductor SC including the source region S1 and the drain region D1 is located directly above the first gate electrode GE1 and also directly below the second gate electrode GE2.

A method of manufacturing the oxide semiconductor SC including these regions will be described with reference to FIG. 3.

After silicon nitride is deposited on the first gate electrode GE1 to form the first insulating film 11 having a substantially constant film thickness, the region where a thick film region is to be formed is removed by etching or the like, thus forming a recess portion. Then, silicon oxide is deposited on the first insulating film 11 and further patterned to form the second insulating film 12 including a thick film region and a thin film region.

An oxide semiconductor film is then formed on the second insulating film 12, and the oxide semiconductor film is patterned to form an island-shaped oxide semiconductor SC that intersects the first region 121. The oxide semiconductor SC is formed to have high resistance.

Subsequently, with hydrogen (H) diffused from the first insulating film 11 via the second insulating film 12, a part of the oxide semiconductor SC is made low-resistant. At this time, the hydrogen diffused from the region 111 of the first insulating film 11 is absorbed by the first region 121 which is a thick film region, and cannot easily reach the oxide semiconductor SC. For this reason, the portion of the oxide semiconductor SC, which overlaps the first region 121 has high resistance and forms the channel region C1.

On the other hand, hydrogen diffused from the region 112 of the first insulating film 11 permeates through the second region 122 and the third region 123, which are thin film regions, and reaches the oxide semiconductor SC. As a result, the portion of the oxide semiconductor SC, which overlaps the second region 122 and the third region 123 is made low-resistant.

Similarly, hydrogen diffused from the region 113 of the first insulating film 11 permeates through the fourth region 124 and the fifth region 125, which are thin film regions, and reaches the oxide semiconductor SC. Therefore, the portions of the oxide semiconductor SC, which overlap the fourth region 124 and the fifth region 125 are made low-resistant.

After that, the source electrodes SE and the drain electrodes DE are formed to be in contact with the oxide semiconductor SC. At this time, the portion of the oxide semiconductor SC, which is in contact with the source electrode SE is made further low-resistant because oxygen (O) is absorbed by the source electrode SE, and thus the source region S1 is formed. Further, in the portion of the oxide semiconductor SC, which is between the channel region C1 and the source region S1, oxygen absorption by the source electrode SE is restricted, and therefore a low-resistance region LS1 which has a lower resistance than that of the channel region C1 but a higher resistance than that of the source region S1 is formed.

Moreover, the portion of the oxide semiconductor SC, which is in contact with the drain electrode DE is made further low-resistant because oxygen (O) is absorbed by the drain electrode DE, and thus the drain region D1 is formed. Further, in the portion of the oxide semiconductor SC, which is between the channel region C1 and the drain region D1, the oxygen absorption by the drain electrode DE is restricted, and therefore a low-resistance region LD1 which has a lower resistance than that of the channel region C1 but a higher resistance than that of the drain region D1 is formed.

Then, silicon oxide is deposited on the oxide semiconductor SC, the source electrode SE, and the drain electrode DE to form the third insulating film 13. Thus, the portions of the oxide semiconductor SC, located between the source electrode SE and the drain electrode DE (namely, the channel region C1, the low-resistance regions LS1 and LD1) are covered by the third insulating film 13. The oxygen (O) contained in the third insulating film 13 is supplied to the oxide semiconductor SC. As a result, the channel region C1 the low-resistance regions LS1 and LD1 are made resistant higher than those of the source region S1 and the drain region D1.

Incidentally, in a transistor configured to comprise an oxide semiconductor SC as a semiconductor, the degradation may occur due to hot carriers caused by the application of high voltage between the source and drain, and therefore the threshold voltage may shift significantly.

In this embodiment, the oxide semiconductor SC includes low-resistance regions LS1 and LD1 adjacent to the channel region C1. With this configuration, the degradation of the oxide semiconductor SC, which may be caused by hot carriers can be suppressed. As a result, the shift of the threshold voltage is suppressed and the reliability can be improved.

The low-resistance regions LS1 and LD1 are formed by the reduction effect of hydrogen diffused from the first insulating film 11. That is, between the first insulating film 11 and the oxide semiconductor SC, the second insulating film including a thick film region and a thin film region is interposed. The thick film region suppress the diffusion of the hydrogen released from the first insulating film 11, whereas the thin film region passes the hydrogen released from the first insulating film 11. With this configuration, the portion of the oxide semiconductor SC, which overlaps the thin film region is made low resistant by the reduction effect of hydrogen, whereas the portion that overlaps the thick film region is not substantially affected by the reduction effect of hydrogen to retain its high resistance state. Thus, due to the difference in hydrogen supply via the second insulating film 12, the channel region C1 and the low-resistance regions LS1 and LD1 are formed. Therefore, a highly reliable oxide semiconductor transistor can be easily formed.

With regard to the film thickness of the second insulating film 12, it has been confirmed as described that the effect of suppressing hydrogen diffusion can be obtained when the film thickness T1 of the thick film region is about 200 nm or more. Note that, the film thickness T2 of the thin film region is, for example, 100 nm or less, but from the viewpoint of promoting hydrogen diffusion, the film thickness T2 should preferably be less as possible.

Figure 4:
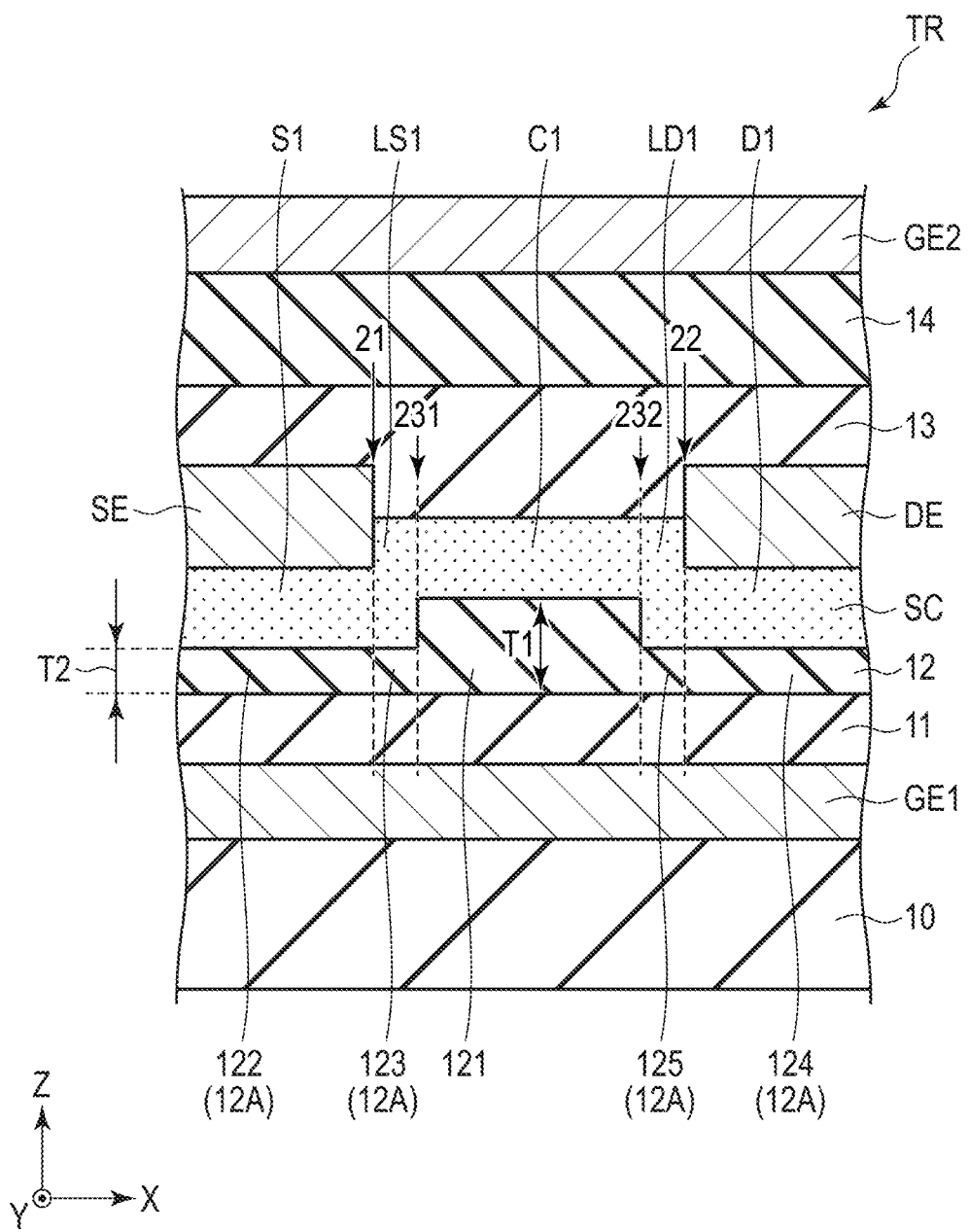
FIG. 4 is a cross-sectional view of another example of the transistor TR shown in FIG. 1.

FIG. 4 is a cross-sectional view of another example of the transistor TR shown in FIG. 1. The example shown in FIG. 4 is different from that of FIG. 2 in that the first region 121 protrudes upward from the peripheral region 12A in the cross-sectional shape of the second insulating film 12. In other words, while a step is formed in the upper surface of the second insulating film 12, the lower surface of the second insulating film 12 is a substantially flat surface. Therefore, the interface between the first insulating film 11 and the second insulating film 12 is a substantially flat surface.

The first insulating film 11 has a substantially constant film thickness in a location directly under the oxide semiconductor SC, and is a flat film substantially without uneven portions.

The second insulating film 12 includes a first region 121 which is a thick film region having a film thickness T1, and a thin film region or peripheral region 12A (a second region 122, a third region 123, a fourth region 124 and a fifth region 125) having a film thickness T2.

The first circumferential portion 231 of the first region 121 does not overlap the first side edge 21 of the source electrode SE, and the second circumferential portion 232 of the first region 121 does not overlap the second side edge 22 of the drain electrode DE. The first circumferential portion 231 and the second circumferential portion 232 are located between the first side edge 21 and the second side edge 22.

In such an example, advantageous effects similar to those of the above-provided example can be obtained.

Figure 5:
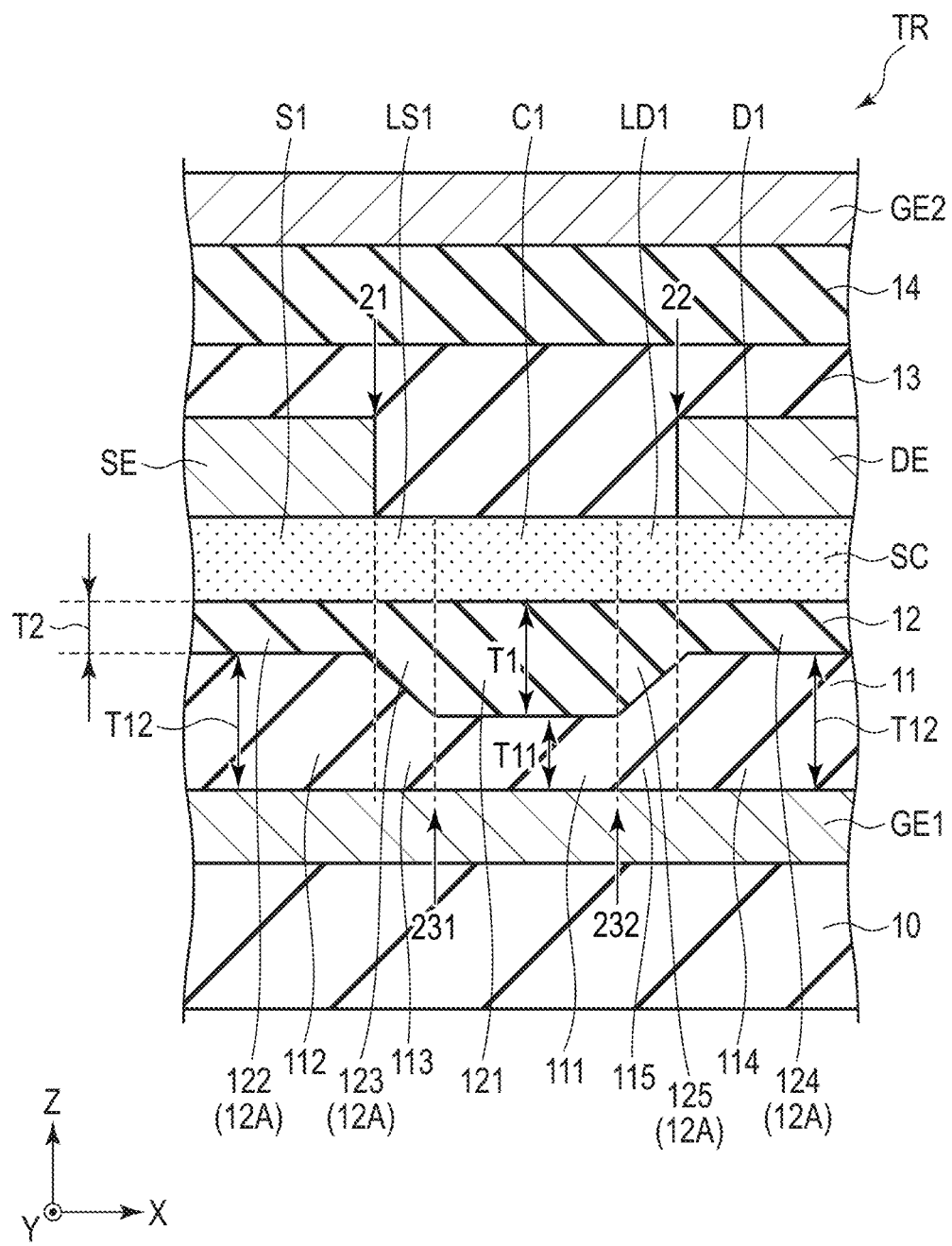
FIG. 5 is a cross-sectional view of still another example of the transistor TR shown in FIG. 1.

FIG. 5 is a cross-sectional view of another example of the transistor TR shown in FIG. 1.

The second insulating film 12 includes a first region 121 which is a thick film region having a film thickness T1, and a thin film region or peripheral region 12A (a second region 122, a third region 123, a fourth region 124 and a fifth region 125).

The first circumferential portion 231 of the first region 121 does not overlap the first side edge 21 of the source electrode SE, and the second circumferential portion 232 of the first region 121 does not overlap the second side edge 22 of the drain electrode DE. The first circumferential portion 231 and the second circumferential portion 232 are located between the first side edge 21 and the second side edge 22.

The third region 123 located between the first region 121 and the second region 122 has a film thickness that gradually decreases as the location shifts from the first region 121 towards the second region 122. More specifically, the third region 123 has a film thickness substantially equivalent to the film thickness T1 in the vicinity of the first circumferential portion 231, and has a film thickness substantially equivalent to the film thickness T2 at the position overlapping the first side edge 21. Between the first side edge 21 and the first circumferential portion 231, the interface between the first insulating film 11 and the second insulating film 12 is an inclined surface.

The fifth region 125 located between the first region 121 and the fourth region 124 has a film thickness that gradually decreases as the location shifts from the first region 121 towards the fourth region 124. More specifically, the fifth region 125 has a film thickness substantially equivalent to the film thickness T1 in the vicinity of the second circumferential portion 232, and has a film thickness substantially equivalent to the film thickness T2 at the position overlapping the second side edge 22.

Between the second side edge 22 and the second circumferential portion 232, the interface between the first insulating film 11 and the second insulating film 12 is an inclined surface.

Focusing on the cross-sectional shape of the second insulating film 12, the first region 121 protrudes downward further than the peripheral region 12A. That is, while a step is formed in the lower surface of the second insulating film 12, the upper surface of the second insulating film 12 is a substantially flat surface. Therefore, the interface between the second insulating film 12 and the oxide semiconductor SC is a substantially flat surface.

Next, the cross-sectional structure of the first insulating film 11 will be described.

The first insulating film 11 includes an region 111 which overlaps the first region 121, an region 112 which overlaps the second region 122, an region 113 which overlaps the third region 123, an region 114 which overlaps the fourth region 124, and an region 115 which overlaps the fifth region 125. The film thickness T11 of the region 111 is less than the film thickness T12 of each of the regions 112 and 114. The film thickness of the region 113 gradually decreases as the location shifts from the region 112 towards the region 111. The film thickness of the region 115 gradually decreases as the location shifts from the region 114 towards the region 111.

In such an example, advantageous effects similar to those of the above-provided example can be obtained.

Further, the film thickness of each of the third region 123 and the fifth region 125 has a gradation, and accordingly, the amount of hydrogen supplied to the low-resistance regions LS1 and LD1 as well has a gradation. In the low-resistance regions LS1 and LD1, the amount of hydrogen supplied decreases as the location is closer to the channel region C1, and the lowering of the resistance is suppressed. That is, the resistance value in the low-resistance regions LS1 and LD1 have such a gradient that the value increases as the location is closer to the channel region C1. Therefore, the potential gradient in the vicinity of the source region S1 and in the vicinity of the drain region D1 of the oxide semiconductor SC becomes gentle, and the degradation of the oxide semiconductor SC is suppressed.

Figure 6:
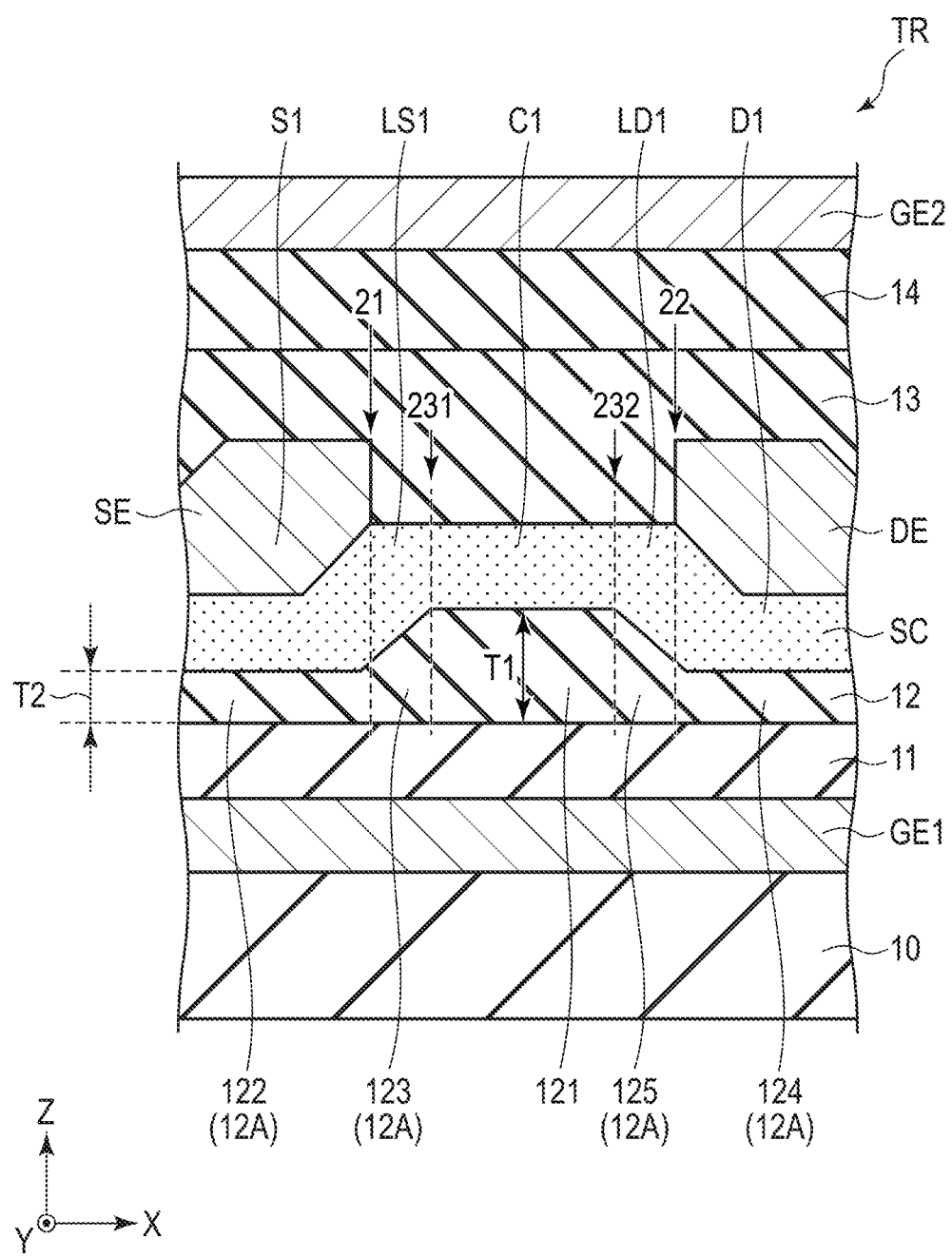
FIG. 6 is a cross-sectional view of still another example of the transistor TR shown in FIG. 1.

FIG. 6 is a cross-sectional view of another example of the transistor TR shown in FIG. 1. The example shown in FIG. 6 is different from that of FIG. 5 in that the first region 121 protrudes upward further than the peripheral region 12A in the cross-sectional shape of the second insulating film 12. More specifically, while a step is formed in the upper surface of the second insulating film 12, the lower surface of the second insulating film 12 is a substantially flat surface. Therefore, the interface between the first insulating film 11 and the second insulating film 12 is a substantially flat surface.

The first insulating film 11 has a substantially constant film thickness in a location directly under the oxide semiconductor SC, and is a flat film substantially without uneven portions.

The second insulating film 12 includes a first region 121 which is a thick film region having a film thickness T1, and a thin film region or peripheral region 12A (a second region 122, a third region 123, a fourth region 124 and a fifth region 125).

The first circumferential portion 231 of the first region 121 does not overlap the first side edge 21 of the source electrode SE, and the second circumferential portion 232 of the first region 121 does not overlap the second side edge 22 of the drain electrode DE. The first circumferential portion 231 and the second circumferential portion 232 are located between the first side edge 21 and the second side edge 22.

In such an example, advantageous effects similar to those of the example shown in FIG. 5 can be obtained.

As described above, according to the present embodiments, it is possible to provide a semiconductor device that can improve reliability.

Based on the semiconductor device which has been described in the above-described embodiments, a person having ordinary skill in the art may achieve a semiconductor device with an arbitral design change; however, as long as they fall within the scope and spirit of the present invention, such a semiconductor device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A semiconductor device comprising:
    an insulating substrate;
    a first insulating film disposed above the insulating substrate and formed of silicon nitride;
    a second insulating film disposed above the first insulating film and formed of silicon oxide, including a first region and a peripheral region surrounding the first region and thinner than the first region;
    an oxide semiconductor disposed on the second insulating film and intersecting the first region;
    a source electrode overlapping the peripheral region and in contact with the oxide semiconductor; and
    a drain electrode overlapping the peripheral region, separated from the source electrode and in contact with the oxide semiconductor, wherein
    in planar view, the first region is located between the source electrode and the drain electrode, and separated from the source electrode and the drain electrode.

2. The semiconductor device of claim 1, wherein the peripheral region comprises:
    a second region located directly below the source electrode;
    a third region located between the first region and the second region and having a film thickness equivalent to that of the second region;
    a fourth region located directly below the drain electrode; and
    a fifth region located between the first region and the fourth region and having a film thickness equivalent to that of the fourth region.

3. The semiconductor device of claim 2, wherein an interface between the second insulating film and the oxide semiconductor is a substantially flat surface.

4. The semiconductor device of claim 2, wherein the first insulating film includes a recess portion overlapping the first region.

5. The semiconductor device of claim 4, wherein the first region is a projecting portion protruding toward the recess portion.

6. The semiconductor device of claim 2, wherein an interface between the first insulating film and the second insulating film is a substantially flat surface.

7. The semiconductor device of claim 2, wherein the first region is a projecting portion protruding toward the oxide semiconductor.

8. The semiconductor device of claim 1, wherein the peripheral region comprises:
    a second region located directly below the source electrode;
    a third region located between the first region and the second region and having a film thickness decreasing from the first region towards the second region;
    the fourth region located directly below the drain electrode; and
    a fifth region located between the first region and the fourth region and having a film thickness decreasing from the first region towards the fourth region.

9. The semiconductor device of claim 8, wherein an interface between the second insulating film and the oxide semiconductor is a substantially flat surface.

10. The semiconductor device of claim 9, wherein an interface between the third region and the first insulating film and an interface between the fifth region and the first insulating film are inclined surfaces.

11. The semiconductor device of claim 8, wherein the first insulating film includes a recess portion overlapping the first region.

12. The semiconductor device of claim 11, wherein the first region is a projecting portion protruding toward the recess portion.

13. The semiconductor device of claim 8, wherein an interface between the first insulating film and the second insulating film is a substantially flat surface.

14. The semiconductor device of claim 13, wherein an interface between the third region and the oxide semiconductor and an interface between the fifth region and the oxide semiconductor are inclined surfaces.

15. The semiconductor device of claim 8, wherein the first region is a projecting portion protruding toward the oxide semiconductor.

16. The semiconductor device of claim 1, further comprising:
    a first gate electrode disposed between the insulating substrate and the first insulating film;
    a third insulating film covering the source electrode and the drain electrode, being in contact with the oxide semiconductor between the first side edge of the source electrode and the second side edge of the drain electrode, and formed of silicon oxide;
    a fourth insulating film disposed on the third insulating film; and
    a second gate electrode disposed on the fourth insulating film.

* * * * *